US009900990B2

(12) United States Patent
Kim et al.

(10) Patent No.: US 9,900,990 B2
(45) Date of Patent: Feb. 20, 2018

(54) FLEXIBLE PRINTED CIRCUIT BOARD (71) Applicant: SAMSUNG DISPLAY CO., LTD., Yongin-si, Gyeonggi-Do (KR)

(72) Inventors: Ki Hyuk Kim, Yongin-si (KR); Cheol-Ho Lee, Hwaseong-si (KR); Hee-Kwon Lee, Asan-si (KR); Seuk Whan Lee, Suwon-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/089,696

(22) Filed: Apr. 4, 2016

(65) Prior Publication Data
US 2016/0309579 A1 Oct. 20, 2016

(30) Foreign Application Priority Data

Apr. 16, 2015 (KR) .................. 10-2015-0053923

(51) Int. Cl.
*H05K 1/02* (2006.01)
*H05K 1/11* (2006.01)
*H05K 1/18* (2006.01)
*H05K 3/40* (2006.01)

(52) U.S. Cl.
CPC .......... *H05K 1/189* (2013.01); *H05K 1/0227* (2013.01); *H05K 1/0259* (2013.01); *H05K 1/0219* (2013.01); *H05K 1/0298* (2013.01); *H05K 1/118* (2013.01); *H05K 3/4007* (2013.01); *H05K 2201/05* (2013.01); *H05K 2201/053* (2013.01); *H05K 2201/10136* (2013.01)

(58) Field of Classification Search
CPC .... H05K 1/189; H05K 1/0259; H05K 1/0219; H05K 2201/053; H05K 2201/10136; H05K 3/4007; H05K 1/0298; H05K 1/118
See application file for complete search history.

(56) References Cited

U.S. PATENT DOCUMENTS

| | | | |
|---|---|---|---|
| 6,954,184 B2 * | 10/2005 | Kurashima | G02F 1/13452 345/1.3 |
| 2005/0179850 A1 * | 8/2005 | Du | G02F 1/133615 349/150 |
| 2011/0132642 A1 * | 6/2011 | Shinoda | H05K 1/028 174/254 |
| 2014/0090878 A1 * | 4/2014 | Adachi | H05K 1/036 174/255 |
| 2014/0190729 A1 * | 7/2014 | Briggs | H05K 1/0225 174/254 |

FOREIGN PATENT DOCUMENTS

| | | |
|---|---|---|
| KR | 10-2004-0107052 A | 12/2004 |
| KR | 10-2005-0003514 A | 1/2005 |
| KR | 10-2007-0024919 A | 3/2007 |
| KR | 10-2012-0076968 A | 7/2012 |

* cited by examiner

*Primary Examiner* — Ishwarbhai B Patel
(74) *Attorney, Agent, or Firm* — Lee & Morse, P.C.

(57) ABSTRACT

A flexible printed circuit board including a body portion, a connector, and a protrusion. The body portion has a circuit area with a circuit pattern and a peripheral area adjacent to the circuit area. The connector is for an external device and is coupled to a first side of the body portion. The protrusion protrudes from a second side of the body portion and includes an exposed part of a metal layer.

13 Claims, 8 Drawing Sheets

FLEXIBLE PRINTED CIRCUIT BOARD

CROSS-REFERENCE TO RELATED APPLICATION

Korean Patent Application No. 10-2015-0053923, filed on Apr. 16, 2015, and entitled, "Flexible Printed Circuit Board," is incorporated by reference herein in its entirety.

BACKGROUND

1. Field

One or more embodiments herein relate to a flexible printed circuit board.

2. Description of the Related Art

A variety of flat panel displays have been developed. Examples include liquid crystal displays, plasma display panels, organic light emitting diode (OLED) devices, field effect displays, and electrophoretic display devices. These displays are used in small and light systems such as portable computers (e.g., laptop computers and personal digital assistants), as well as desktop computer monitors and mobile phones.

OLED devices overcome many drawbacks associated with cathode ray tube displays. For example, OLED devices are smaller and lighter and consume less power and are more versatile than cathode ray tube displays.

An OLED device is typically driven by driving signals generated from a printed circuit board. The printed circuit board may be electrically connected to a display panel by a flexible printed circuit board (FPCB). However, the flexible printed circuit board generates electromagnetic interference (EMI) and electrostatic discharge (ESD), especially along the sides of the display panel. The EMI and ESD adversely affect the OLED device, both during manufacturing and in operation.

SUMMARY

In accordance with one or more embodiments, a flexible printed circuit board includes a body portion including a circuit area having a circuit pattern and a peripheral area adjacent to the circuit area; a connector for an external device, the connector coupled to a first side of the body portion; and a protrusion protruding from a second side of the body portion, the protrusion including an exposed part of a metal layer.

Each of the body portion, the connector, and the protrusion may include a first passivation layer; a first metal layer on the first passivation layer; a first insulating layer on the first metal layer; a second metal layer on the first insulating layer; a second insulating layer on the second metal layer; a third metal layer on the second insulating layer; and a second passivation layer on the third metal layer.

The protrusion may include an exposing hole exposing part of the third metal layer, the exposing hole formed in the second passivation layer. The second and third metal layers on the protrusion may be separated from the second and third metal layers on the body portion, and the first to third metal layers on the protrusion may be electrically connected. A first contact hole for exposing part of the first metal layer may be in the first insulating layer provided on the protrusion. A first junction layer electrically connecting the first and second metal layers may be in the first contact hole. The first junction layer may include a conductive material. A second contact hole exposing part of the second metal layer may be in the second insulating layer on the protrusion. A second junction layer electrically connecting the second and third metal layers may be in the second contact hole. The second junction layer may include a conductive material. The first metal layer may be connected to the external device at the connector.

The third metal layer may include a body region overlapping the circuit area of the body portion; and a static electricity moving region separated from the body region and partly exposed through the exposing hole on the protrusion. The static electricity moving region of the third metal layer may be connected to the external device on the connector. The first and second passivation layers may include a solder resist material. The first to third metal layers may include copper or nickel.

In accordance with one or more embodiments, a flexible printed circuit board includes a first area including a circuit pattern; a second area coupled to the first area and including a first conductive layer and a second conductive layer; and a third area between the first area and an external signal path, wherein the first conductive layer is electrically insulated from the circuit pattern in the first area and passes static electricity to the second conductive layer, and wherein the second conductive layer passes the static electricity to the third area through a signal path that passes through the first area, the signal path bypassing the circuit pattern in the first area.

The first area may include a hole; a surface of the first conductive layer may be exposed through the hole; and the second conductive layer may be between the first conductive layer and a external surface of the first area. The third area may include a connector for an external device including the external signal path. The flexible printed circuit board may include a junction layer between the first conductive layer an the circuit pattern in the first area, the junction layer including an insulating material to insulate the circuit pattern from the first conductive layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1-4 illustrate an embodiment of a flexible printed circuit board 10 for a display device. In this embodiment, static electricity travels through a third metal layer 600, a second metal layer 400, and a first metal layer 200 in a protrusion X2 and then travels along the first metal layer 200 to a connector X3.

The flexible printed circuit board 10 may be combined with a pad region 30 of the display device to transmit a driving signal to a display area 50 of the display device. Static electricity may be induced on a first side of the flexible printed circuit board and transmitted into the display device. The static electricity transmitted into the display device may be transmitted, for example, to a ground circuit or a static electricity preventing circuit inside the display device.

Figure 1:
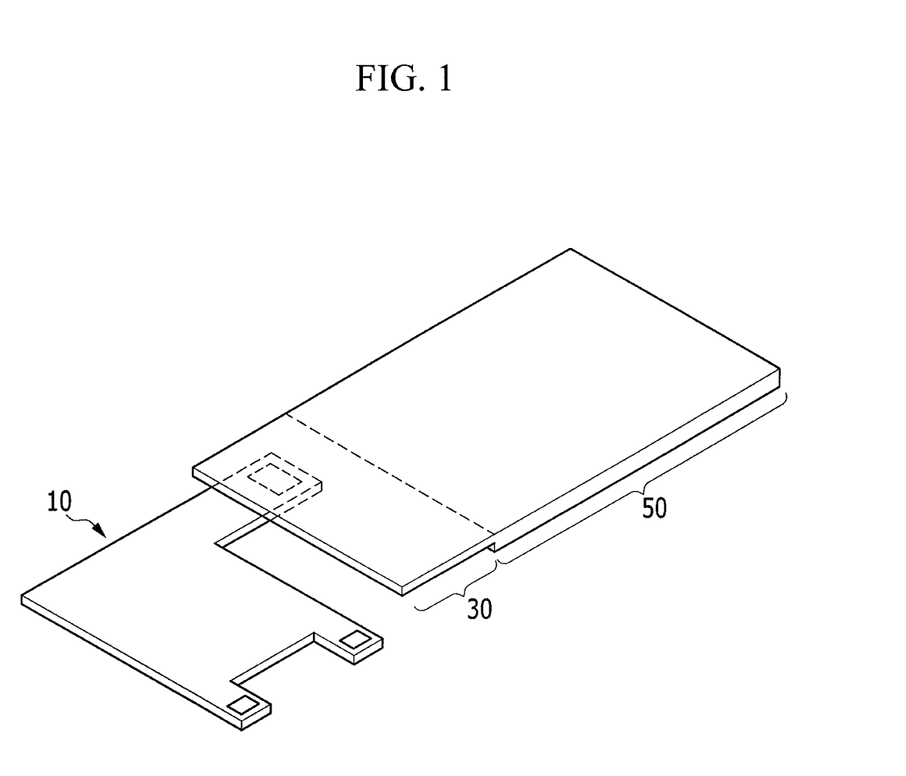
FIG. 1 illustrates an embodiment of a flexible printed circuit board for a display panel.
Figure 2:
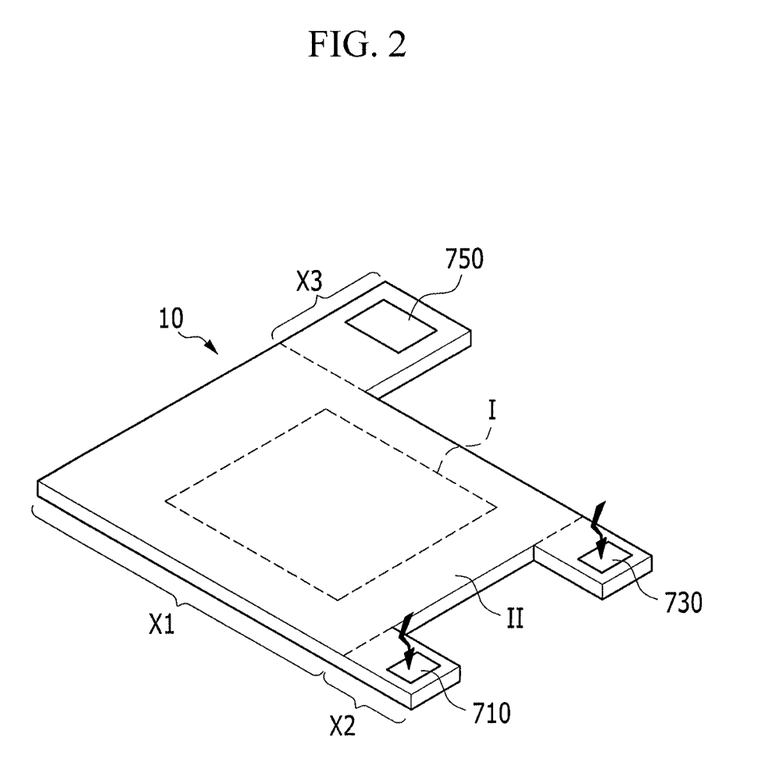
FIG. 2 illustrates another view of the flexible printed circuit board.
Figure 3:
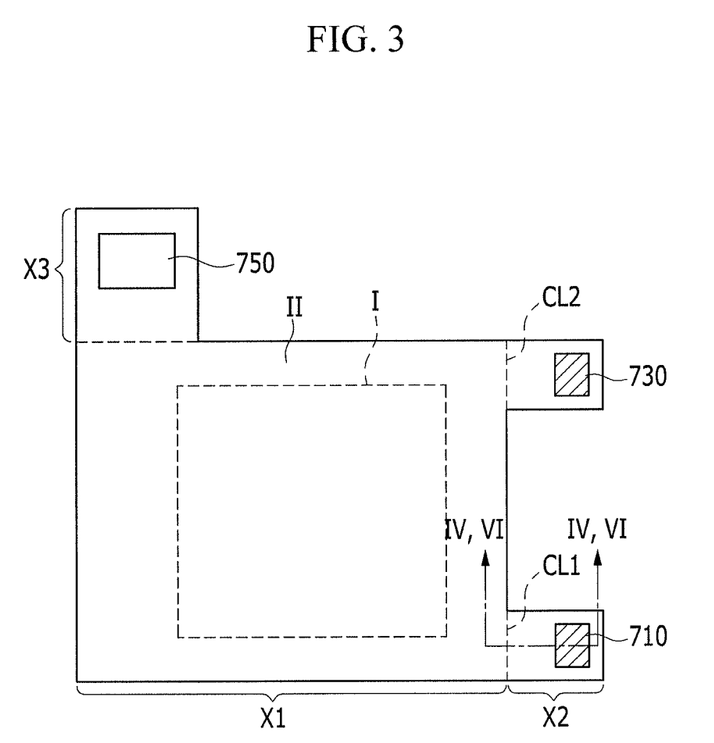
FIG. 3 illustrates another view of the flexible printed circuit board.

More specifically, referring to FIGS. 2 and 3, the flexible printed circuit board 10 includes a body portion X1, a protrusion X2, and a connector X3. The body portion X1 has a circuit area (I) including a circuit pattern and a peripheral area (II) adjacent the circuit area. The circuit pattern may not be included in the peripheral area (II).

The circuit pattern in circuit area (I) may include, for example, wires, resistors, and capacitors and/or a connector for installing an element. The element connector may correspond, for example, to an etch portion of an insulating layer on the metal layer of the region connected to the element, and may expose a metal layer. A wire for receiving induced static electricity may be formed in the peripheral area (II).

The connector X3 may be formed on a first side of the body portion X1 and may be combined with an external device. The external device may correspond, for example, to a pad of the display device. The connector X3 may be electrically connected to the pad of the display device through a third exposing hole 750.

The connector X3 may correspond to an etched portion of an insulating layer on a metal layer of a region connected to the pad and may expose the metal layer therein to form the same. Static electricity input through a protrusion X2 travels pass through the wire of the body portion X1 and is transmitted to the display device through the connector X3.

The protrusion X2 may be formed, for example, on a first side of the body portion X1 to receive external static electricity. The protrusion X2 may protrude on the first side of the body portion X1. Referring to FIG. 3, border lines CL1 and CL2 are located between the body portion X1 and the protrusion X2, and correspond to virtual lines for distinguishing the body portion X1 and the protrusion X2.

Static electricity may be provided to a protruding region that is different in size (e.g., smaller) than the surrounding area. To easily induce static electricity, the protrusion X2 may be formed to protrude at the first side of the body portion X1.

The protrusion X2 may be formed, for example, to have a quadrangular shape, a polygonal (e.g., a triangular or pentagonal) shape, or another shape.

A metal layer is partially exposed on the protrusion X2 to receive static electricity. The static electricity travels from protrusion X2 to the connector X3 through the body portion X1. In one embodiment, a pair of protrusions X2 may be formed on the body portion X1. First and second exposing holes 710 and 730 may be formed on the pair of protrusions X2 to expose the metal layer.

Figure 4:
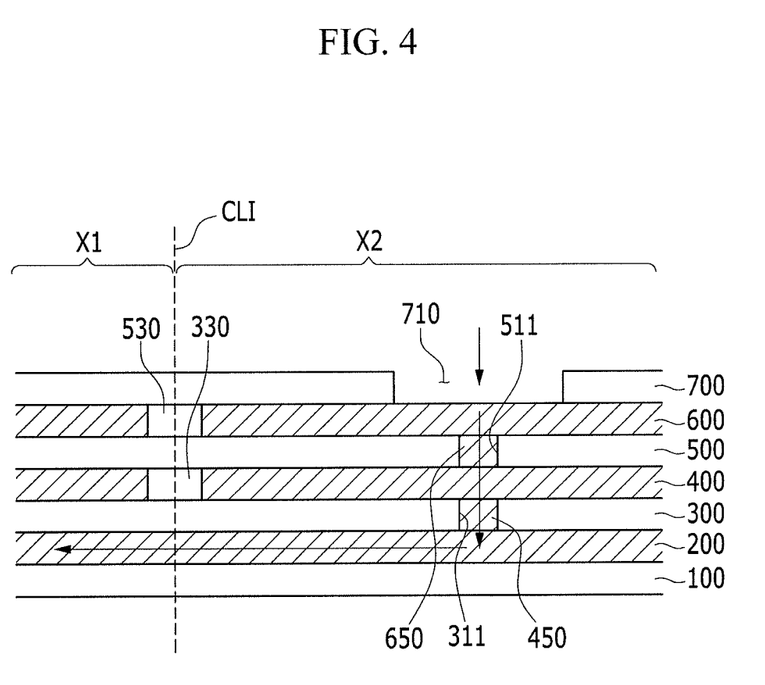
FIG. 4 illustrates an embodiment taken along section line IV-IV in FIG. 3.

Referring to FIG. 4, the flexible printed circuit board 10 includes a plurality of metal layers including a first passivation layer 100, a first metal layer 200, a first insulating layer 300, a second metal layer 400, a second insulating layer 500, a third metal layer 600, and a second passivation layer 700. The body portion X1, the protrusion X2, and the connector X3 are configured with the above-noted stacked structure for the flexible printed circuit board.

In this embodiment, the first passivation layer 100, the first metal layer 200, the first insulating layer 300, the second metal layer 400, the second insulating layer 500, the third metal layer 600, and the second passivation layer 700 are sequentially stacked from bottom to top. In another embodiment, the layers may be stacked in a different order or orientation.

The first and second passivation layers 100 and 700 are respectively provided on an uppermost portion and a lowermost portion of the flexible printed circuit board and protect the metal layer inside the flexible printed circuit board. The first and second passivation layers may be formed, for example, of solder resist.

First to third metal layers 200, 400, and 600 sequentially stacked on the first passivation layer 100 may be formed of a conductive material. For example, the first to third metal layers 200, 400, and 600 may be formed of copper or nickel or another conductive flexible metal. The first to third metal layers 200, 400, and 600 may be etched with a predetermined pattern to form a circuit pattern, or a wire through which static electricity externally provided may be formed on the first to third metal layers 200, 400, and 600.

First and second insulating layers 300 and 500 are formed between respective adjacent pairs of the first to third metal layers 200, 400, and 600. For example, the first insulating layer 300 may be formed between the first and second metal layers 200 and 400. The second insulating layer 500 may be formed between the second and third metal layers 400 and 600. In this case, the first and second insulating layers 300 and 500 electrically separate the first to third metal layers 200, 400, and 600. The first and second insulating layers 300 and 500 may be formed of an inorganic or organic insulating material. An embodiment of the stacked structure of the body portion X1, the protrusion X2, and the connector X3 on the flexible printed circuit board will now be described in detail.

FIG. 4 shows a cross-sectional view of the protrusion X2 of FIG. 3. Static electricity provided through a first exposing hole 710 of the protrusion X2 moves through the third metal layer 600, the second metal layer 400, and the first metal layer 200. The first exposing hole 710 exposes part of the third metal layer 600 on a lower portion, and is formed in the second passivation layer 700. The first exposing hole 710 may be formed, for example, by etching the second passivation layer 700.

Figure 5:
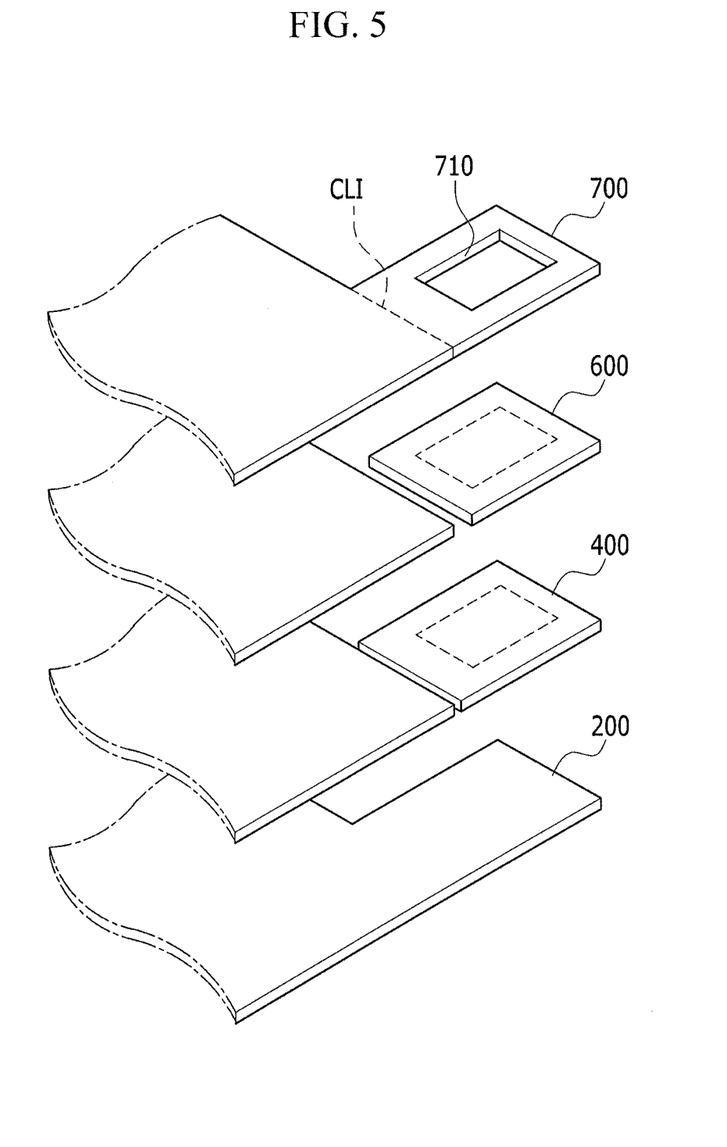
FIG. 5 illustrates an embodiment of a stacked structure.

The third metal layer 600 is separated with reference to the border line CL1 between body portion X1 and protrusion X2. As illustrated in FIG. 5, the third metal layer 600 is separated with respect to the border line CL1, and the input static electricity does not move toward the body portion X1 along the third metal layer 600.

An insulating material 530 may be provided between the third metal layer 600 and a corresponding layer in body portion X1. The insulating material 530 may be formed, for example, of a same insulating material as the first and second insulating layers 300 and 500.

The second metal layer 400 is separated with respect to the border line CL1. As shown in FIG. 5, the second metal layer 400 is separated with reference to the border line CL1, and the input static electricity does not move toward body portion X1 along the second metal layer 400. The above-noted third metal layer 600 and the second metal layer 400 may be connected in a vertical direction and an inflow of static electricity may move to the second metal layer 400 from the third metal layer 600.

An insulating material 330 may be provided between the separated second metal layer 400 and a corresponding layer in the body portion X1. The insulating material 330 may be formed, for example, of a same insulating material as the first and second insulating layers 300 and 500.

A first contact hole 311 exposes part of the first metal layer 200 provided on a lower portion, and may be formed on the first insulating layer 300 inside the protrusion X2. A second contact hole 511 exposes part of the second metal layer 400 provided on a lower portion, and may be formed on the second insulating layer 500 inside the protrusion X2.

A first junction layer 450 for electrically connecting the first and second metal layers 200 and 400 is formed inside the first contact hole 311 of the first insulating layer 300. The first junction layer 450 may be formed of a conductive material. For example, the first junction layer 450 may be formed of the same material as the first and second metal layers 200 and 400, e.g., copper or nickel.

A second junction layer 650 for electrically connecting the second and third metal layers 400 and 600 is formed inside the second contact hole 511 of the second insulating layer 500. Like the first junction layer 450, the second junction layer 650 may be formed of a conductive material. For example, the second junction layer 650 may be formed of the same material as the second and third metal layers 400 and 600, e.g., copper or nickel.

Figure 8:
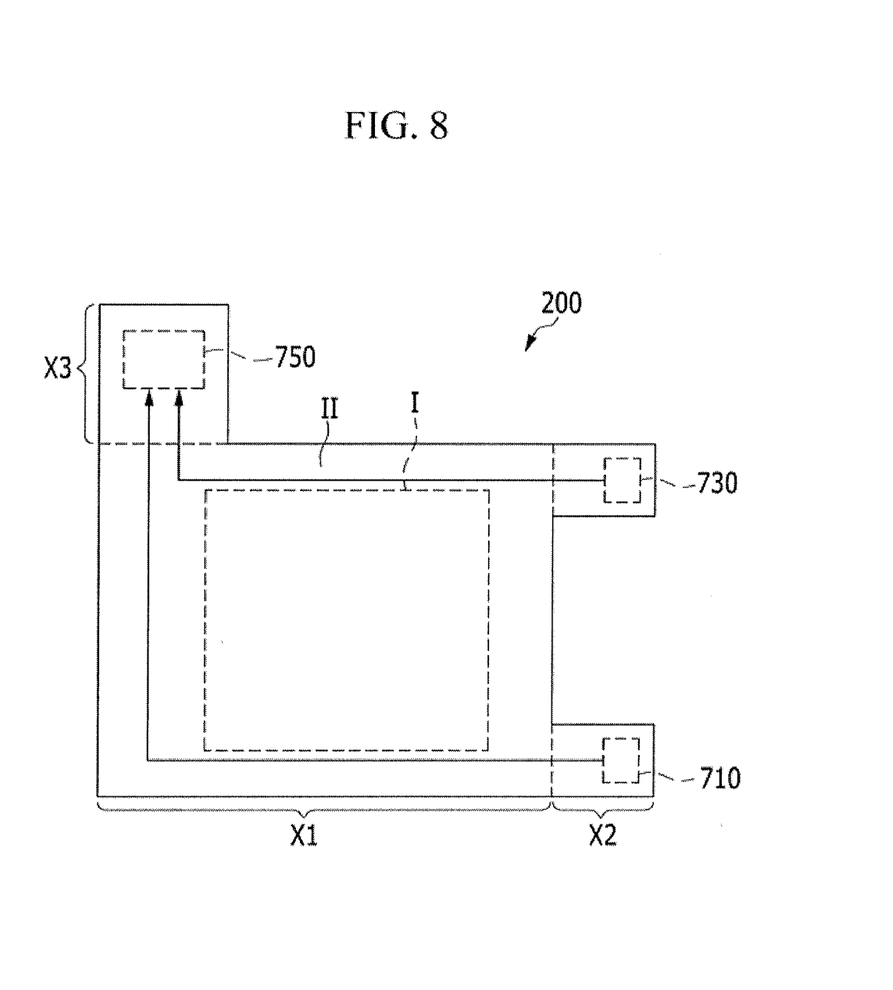
FIG. 8 illustrates an embodiment including a first metal layer of the flexible printed circuit board in FIG. 4.

As illustrated in FIG. 8, the first metal layer 200 is not separated from the body portion X1 at a border with the protrusion X2, but is connected to or formed integrally a corresponding layer of the body portion X1. The first metal layer 200 is disposed to be connected inside the connector X3.

Static electricity provided through the first exposing hole 710 in the protrusion X2 reaches the third metal layer 600, and then passes through the second junction layer 650, the second metal layer 400, the first junction layer 450, and the first metal layer 200. As further illustrated in FIG. 8, the static electricity moves toward the connector X3 along the first metal layer 200. When the static electricity reaches the connector X3, the static electricity goes to an external device connected to the connector X3.

The static electricity does not pass through the second and third metal layers 400 and 600 on the body portion X1, and thus does not influence a circuit pattern generally formed on the second and third metal layers 400 and 600 of the body portion X1.

Figure 6:
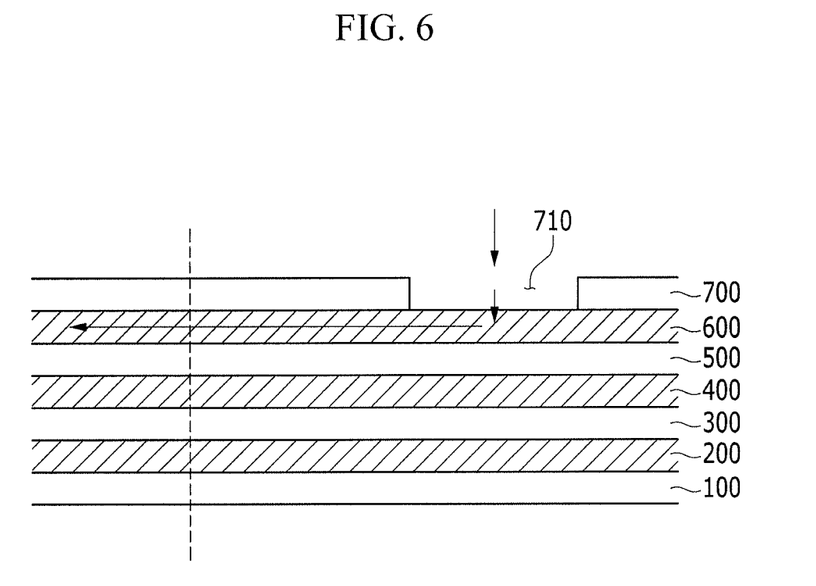
FIG. 6 illustrates another embodiment taken along section VI-VI in FIG. 3.
Figure 7:
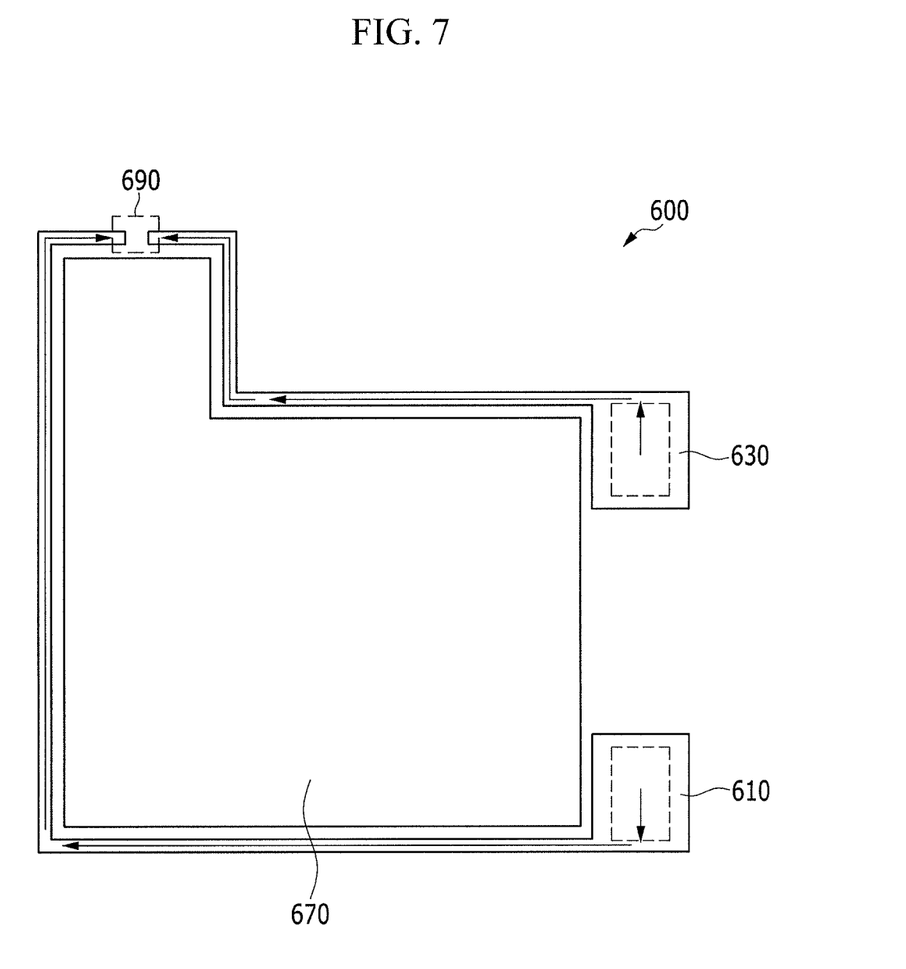
FIG. 7 illustrates an embodiment including a third metal layer of the flexible printed circuit board in FIG. 6.

FIG. 6 illustrates a cross-sectional view of another embodiment of a flexible printed circuit board. This view is taken along line VI-VI in FIG. 3. FIG. 7 shows a top plan view of a third metal layer of the flexible printed circuit board in FIG. 6.

Referring to FIGS. 6 and 7, static electricity is received through the first exposing hole 710 in the protrusion X2, moves on the third metal layer 600, and goes to an external device or path through the connector X3. More specifically, in one or more of the aforementioned embodiments, static electricity moves to the lower side through the third metal layer 600, the second metal layer 400, and the first metal layer 200 in the protrusion X2, moves on the first metal layer 200, and moves to the outside through the connector X3. However, in this embodiment, static electricity does not move to the lower portion where the first and second metal layers 200 and 400 are provided, but instead moves on the third metal layer 600 of the upper portion.

The third metal layer 600 includes a body region 670 and static electricity moving regions 610 and 630. The body region 670 of the third metal layer 600 may overlap a circuit area (I) of the body portion X1. The circuit pattern may include, for example, wires, resistors, and capacitors in the body region 670.

The static electricity moving regions 610 and 630 of the third metal layer 600 are electrically separated from the body region 670. The static electricity moving regions 610 and 630 correspond to a path on which the static electricity input through the first exposing hole 710 moves.

Referring to FIG. 6, static electricity input through the first exposing hole 710 moves on the third metal layer 600 on an upper portion. Thus, the static electricity does not move to the first and second metal layers 200 and 400.

Referring to FIG. 7, the static electricity moving regions 610 and 630 of the third metal layer 600 may be formed around the body region 670 and may provide a path for the moving static electricity. An end portion 690 of the static electricity moving regions 610 and 630 of the third metal layer 600 may be connected to an external device at the connector X3.

In this embodiment, static electricity received through the first exposing hole 710 in the protrusion X2 reaches the third metal layer 600. The static electricity does not pass through the first and second metal layers 200 and 400, but instead moves toward the connector X3 along the third metal layer 600. The static electricity having reached the connector X3 goes to the external device connected to the connector X3, and thus does not influence the circuit pattern generally formed on the third metal layer 600 of the body portion X1.

By way of summation and review, a flexible printed circuit board generates electromagnetic interference (EMI) and electrostatic discharge (ESD), especially at a portion connected to a printed circuit board on the side of the display panel. The EMI and ESD adversely affects performance of the host (e.g., display) and may also cause difficulties during the manufacturing process. In accordance with one or more of the aforementioned embodiments, a flexible printed circuit board is provided which moves static electricity through a metal layer that bypasses a circuit pattern on the flexible printed circuit board.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A flexible printed circuit board, comprising:
   a body portion including a circuit area having a circuit pattern and a peripheral area adjacent to the circuit area;
   a connector for an external device, the connector coupled to a first side of the body portion; and
   a protrusion protruding from a second side of the body portion, the protrusion including an exposed part of a metal layer, wherein each of the body portion, the connector, and the protrusion includes:
   a first passivation layer;
   a first metal layer on the first passivation layer;
   a first insulating layer on the first metal layer;
   a second metal layer on the first insulating layer;
   a second insulating layer on the second metal layer;
   a third metal layer on the second insulating layer; and
   a second passivation layer on the third metal layer, and
   wherein the second and third metal layers on the protrusion are separated from the second and third metal layers on the body portion, and the first to third metal layers on the protrusion are electrically connected.

2. The flexible printed circuit board as claimed in claim 1, wherein the protrusion includes an exposing hole exposing part of the third metal layer, the exposing hole formed in the second passivation layer.

3. The flexible printed circuit board as claimed in claim 2, wherein the first metal layer is connected to the external device at the connector.

4. The flexible printed circuit board as claimed in claim 2, wherein a first contact hole for exposing part of the first metal layer is in the first insulating layer on the protrusion.

5. The flexible printed circuit board as claimed in claim 4, wherein a first junction layer electrically connecting the first and second metal layers is in the first contact hole.

6. The flexible printed circuit board as claimed in claim 5, wherein the first junction layer includes a conductive material.

7. The flexible printed circuit board as claimed in claim 2, wherein a second contact hole exposing part of the second metal layer is in the second insulating layer on the protrusion.

8. The flexible printed circuit board as claimed in claim 7, wherein a second junction layer electrically connecting the second and third metal layers is in the second contact hole.

9. The flexible printed circuit board as claimed in claim 8, wherein the second junction layer includes a conductive material.

10. The flexible printed circuit board as claimed in claim 2, wherein the third metal layer includes:
    a body region overlapping the circuit area of the body portion; and
    a static electricity moving region separated from the body region and partly exposed through the exposing hole on the protrusion.

11. The flexible printed circuit board as claimed in claim 10, wherein the static electricity moving region of the third metal layer is connected to the external device on the connector.

12. The flexible printed circuit board as claimed in claim 2, wherein the first and second passivation layers include a solder resist material.

13. The flexible printed circuit board as claimed in claim 2, wherein the first to third metal layers include copper or nickel.

* * * * *